(12) United States Patent
Brodoceanu et al.

(10) Patent No.: US 11,005,014 B2
(45) Date of Patent: May 11, 2021

(54) OPTICS FORMATION USING PICK-UP TOOLS

(71) Applicant: Facebook Technologies, LLC, Menlo Park, CA (US)

(72) Inventors: Daniel Brodoceanu, Cork (IE); Patrick Joseph Hughes, Cork (IE); Pooya Saketi, Cork (IE); Oscar Torrents Abad, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/049,728

(22) Filed: Jul. 30, 2018

(65) Prior Publication Data

US 2020/0035882 A1 Jan. 30, 2020

(51) Int. Cl.

| H01L 21/00 | (2006.01) |
| H01L 33/58 | (2010.01) |
| H01L 21/67 | (2006.01) |
| H01L 25/075 | (2006.01) |
| H01L 33/00 | (2010.01) |
| H01L 33/06 | (2010.01) |

(52) U.S. Cl.
CPC ........ *H01L 33/58* (2013.01); *H01L 21/67144* (2013.01); *H01L 25/0753* (2013.01); *H01L 33/0093* (2020.05); H01L 33/06 (2013.01); H01L 2933/0058 (2013.01)

(58) Field of Classification Search
CPC .............. H01L 33/58; H01L 21/67144; H01L 25/0753; H01L 33/0079; H01L 33/06
See application file for complete search history.

(56) References Cited

U.S. PATENT DOCUMENTS

| 7,518,149 | B2 | 4/2009 | Maaskant et al. | |
| 2015/0014708 | A1* | 1/2015 | Speier | H01L 25/0753 |
| | | | | 257/80 |
| 2015/0034984 | A1* | 2/2015 | Shin | H01L 21/565 |
| | | | | 257/98 |
| 2018/0114886 | A1* | 4/2018 | Liu | G02B 19/0014 |
| 2018/0158704 | A1 | 6/2018 | Saketi et al. | |
| 2018/0261582 | A1* | 9/2018 | Henry | H01L 27/1214 |
| 2018/0356570 | A1* | 12/2018 | Wu | B32B 17/064 |

FOREIGN PATENT DOCUMENTS

| GB | 2541970 A | 3/2017 |
| GB | 2545155 A | 6/2017 |

OTHER PUBLICATIONS

PCT/US2019/044177, "International Search Report and Written Opinion", dated Nov. 15, 2019, 12 pages.

* cited by examiner

*Primary Examiner* — Victor A Mandala
*Assistant Examiner* — Colleen E Snow
(74) *Attorney, Agent, or Firm* — Weaver Austin Villeneuve & Sampson LLP

(57) ABSTRACT

Techniques related to optics formation using pick-up tools are disclosed. Optical elements are formed by pressing a pick-up tool (PUT) against elastomeric material deposited on a light-outputting side of light-emitting diode (LED) devices. Pressing the PUT against the elastomeric material causes a molded shape of the PUT to be transferred to the elastomeric material. This forms the optical elements in the elastomeric material.

17 Claims, 10 Drawing Sheets

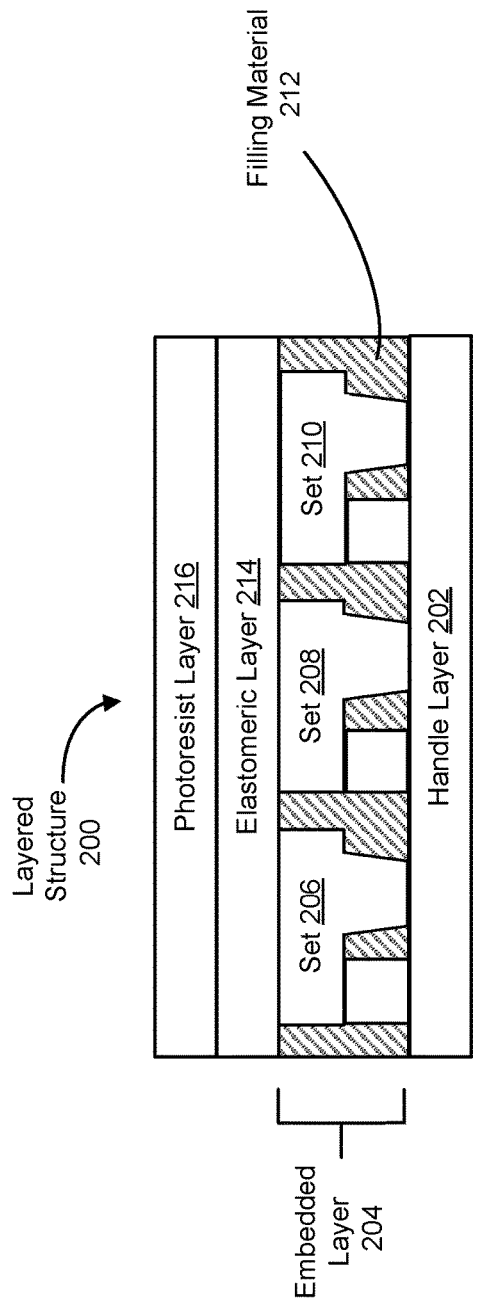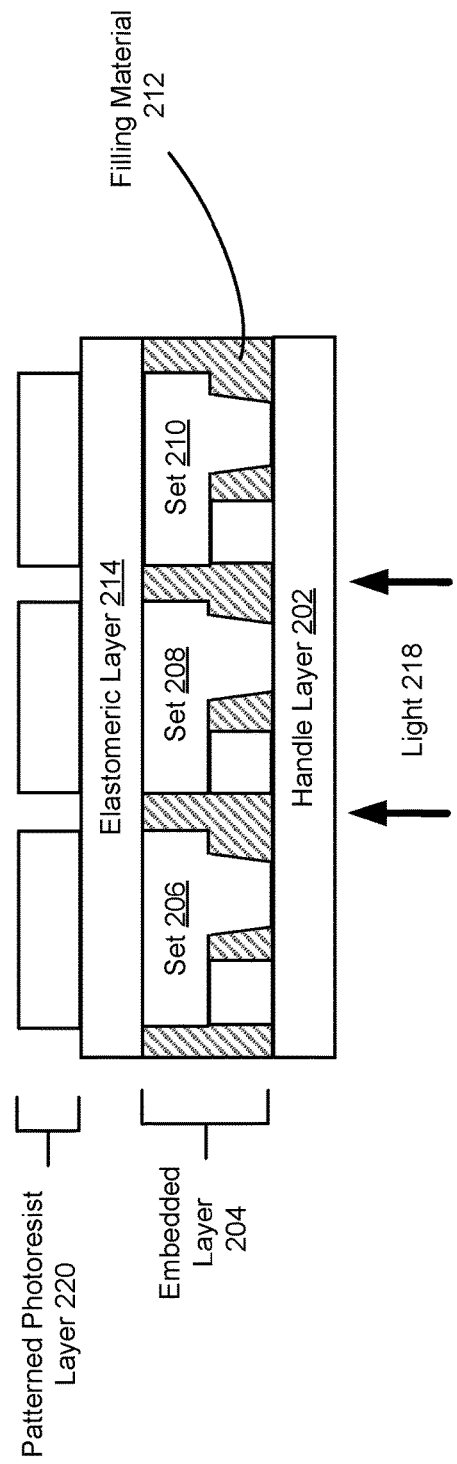

OPTICS FORMATION USING PICK-UP TOOLS

BACKGROUND

The disclosure relates generally to semiconductor device fabrication, and more specifically to formation of optical elements on semiconductor devices.

Semiconductor devices have become prevalent in electronics for providing such benefits as reduced size, improved durability, and increased efficiency. For example, in contrast to an incandescent light bulb, a light-emitting diode (LED) is typically smaller, lasts several times longer, and converts proportionately more energy into light instead of heat. Accordingly, semiconductor devices have even been incorporated into display systems, such as those found in televisions, computer monitors, laptop computers, tablets, smartphones, and wearable electronic devices. In particular, tiny LEDs can be used to form the sub-pixels of a display system. However, manipulating such tiny LEDs can be challenging. Furthermore, the brightness of such tiny LEDs can be limited by their size.

SUMMARY

This disclosure relates to the formation of optical elements on semiconductor devices. In some embodiments, the semiconductor devices are LEDs having elastomeric material deposited thereon. The elastomeric material enables a pick-up tool (PUT) to adhere to the LEDs, which can be transported by the PUT onto a target substrate. The elastomeric material can also be molded into optical elements that increase the brightness of the LEDs.

Disclosed herein are techniques related to concurrently picking up the LEDs and forming optical elements on the LEDs. This can be achieved using a PUT having a pick-up surface that is adapted for molding optical elements. For example, the PUT may have one or more cavities that each have the shape of an optical element. Thus, pressing the PUT against elastomeric material not only causes the PUT to adhere to the elastomeric material, but also forms one or more optical elements in the elastomeric material.

Advantageously, the techniques disclosed herein can reduce sources of error in the fabrication process. For example, errors may be introduced by performing alignment for device pick-up separately from performing alignment for optics formation. Thus, performing alignment once for both device pick-up and optics formation can reduce errors.

BRIEF DESCRIPTION OF THE DRAWINGS

Illustrative embodiments are described with reference to the following figures.

FIGS. 2A-D illustrate an example approach for forming elastomeric interfaces on semiconductor devices, in accordance with an embodiment.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Disclosed herein are techniques that enable error reduction during fabrication of semiconductor devices, such as LEDs and photodiodes. In some embodiments, the fabricated semiconductor devices are tiny inorganic LEDs known as microLEDs having optical elements formed thereon. Example optical elements include, without limitation, a lens, a waveguide, and/or a diffraction grating. As used herein, a microLED may refer to an LED that has an active light-emitting area with a linear dimension that is less than 50 µm, less than 20 µm, or less than 10 µm. For example, the linear dimension may be as small as 2 µm or 4 µm.

Semiconductor Devices

Figure 1:
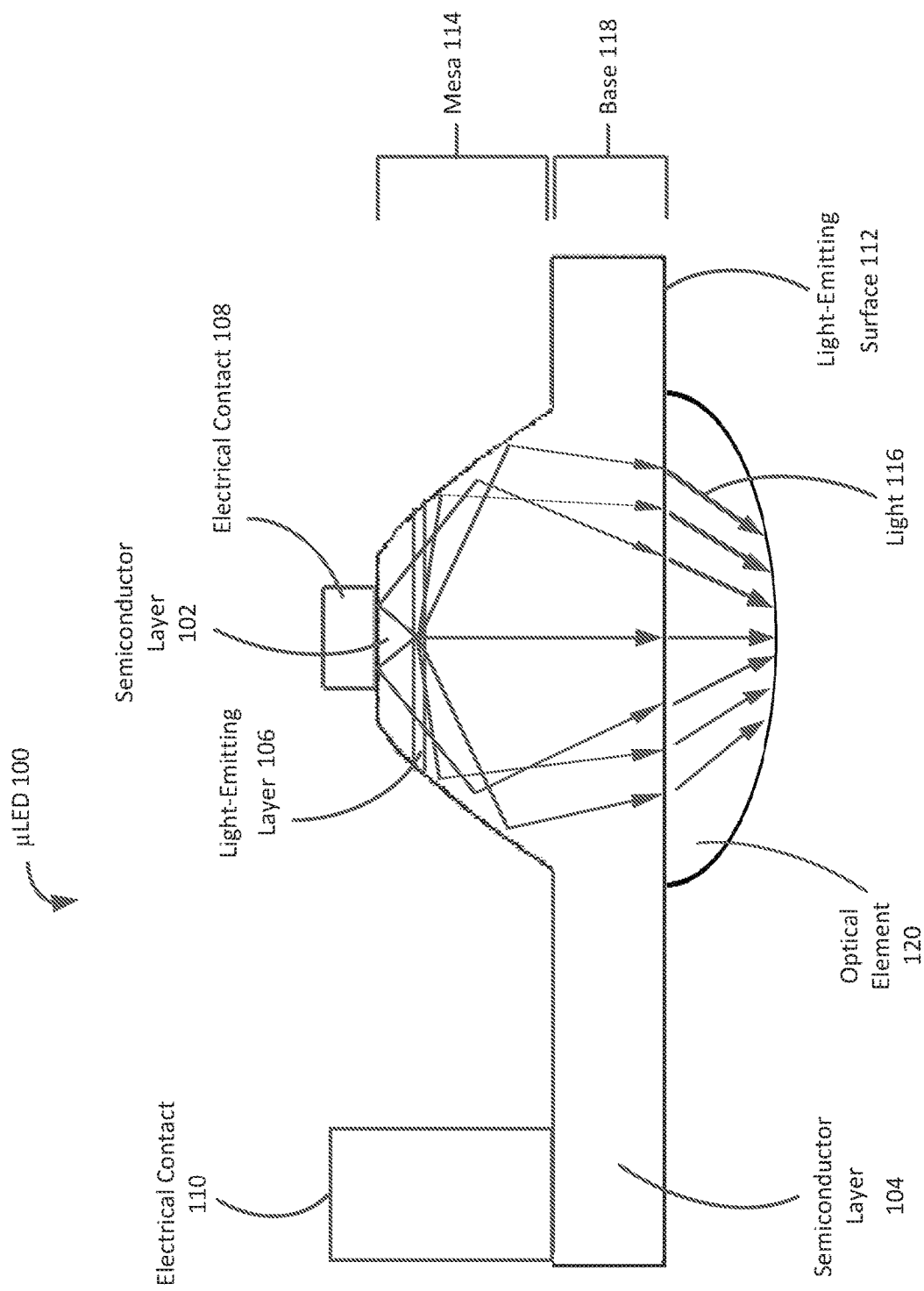
FIG. 1 illustrates an example semiconductor device, in accordance with an embodiment.

Referring to FIG. 1, a cross-sectional view of an example semiconductor device is provided. More specifically, the semiconductor device is an example of a microLED 100. As used herein, a microLED may refer to an LED that has an active light-emitting area with a linear dimension that is less than 50 µm, less than 20 µm, or less than 10 µm. For example, the linear dimension may be as small as 2 µm or 4 µm. Their small size enables a display system to have a single pixel comprising three of them: a red micro LED, a green micro LED, and a blue micro LED. Their small size also enables micro LEDs to be lightweight, making them particularly suitable for use in wearable display systems, such as watches and computing glasses.

The microLED 100 includes, among other components, a semiconductor structure. The semiconductor structure comprises semiconductor layers 102-104 and a light-emitting layer 106 that sits between the semiconductor layers 102-104. For example, the microLED 100 may comprise a semiconductor structure in which the light-emitting layer 106 is a layer of indium gallium nitride that is sandwiched between a layer of p-type gallium nitride and a layer of n-type gallium nitride. In some embodiments, semiconductor layer 102 is a p-type semiconductor, and semiconductor layer 104 is an n-type semiconductor. In some embodiments, semiconductor layer 102 is an n-type semiconductor, and semiconductor layer 104 is a p-type semiconductor.

The semiconductor layers 102-104 are operatively coupled to electrical contacts 108-110, respectively. The electrical contacts 108-110 are typically made of a conductive material, such as a metallic material. In the example of FIG. 1, the electrical contacts 108-110 are both located on a top surface of the semiconductor structure such that they can both support the microLED 100 when it is mounted on a substrate including a control circuit. However, in some embodiments, electrical contacts can be located on opposite surfaces of a semiconductor structure.

The light-emitting layer 106 includes one or more quantum wells that output light 116 when a voltage is applied across the electrical contacts 108-110. To directionalize the output of light 116, the semiconductor structure may be formed into any of a variety of shapes (e.g., a paraboloid, a cylinder, or a cone) that enable collimation/quasi-collimation of light 116. Such shapes are referred to herein as "mesa" shapes; and collimation and quasi-collimation are collectively referred to herein as "collimation". Collimation results in increased brightness of light output.

In the example of FIG. 1, mesa 114 corresponds to a paraboloid shape that guides light 116 toward through a light-emitting surface 112 of the semiconductor structure. More specifically, the light-emitting layer 106 is approximately positioned at the focal point of the paraboloid such that some of the emitted light is reflected, within a critical angle of total internal reflection, off the inner walls of the paraboloid toward the light-emitting surface 112.

In some embodiments, a mesa shape also has a truncated top that can accommodate an electrical contact. In the example of FIG. 1, mesa 114 corresponds to a paraboloid shape having a truncated vertex that accommodates electrical contact 108. Base 118 refers to the part of the semiconductor structure that is not included in the mesa 114.

To enable further collimation of light 116, an optical element 120 can be formed on the light-emitting surface 112. In the example of FIG. 1, the optical element 120 is a microlens. As will be described in greater detail below, the optical element 120 can be formed from elastomeric material that both (a) facilitates adhesion with a PUT and (b) has suitable optical properties.

The microLED 100 may include other components, such as a dielectric layer, a reflective layer, and a substrate layer. However, to avoid obscuring the disclosure, such components are not illustrated in FIG. 1.

Formation of Patterned Elastomeric Layer

Elastomeric material may be deposited on a set of one or more semiconductor devices to enable (a) forming optical elements on the set and/or (b) picking up the set using a PUT. The elastomeric material may be deposited on all or part of a particular side/surface of the set. For example, if the set comprises one or more LED devices, the elastomeric material may be deposited on all or part of a light-outputting side (e.g., light-emitting surface 112) of the set. However, it is unnecessary for the elastomeric material to extend beyond the particular side/surface of the set. Thus, at least some of the unnecessary elastomeric material can be removed from regions between different sets of one or more semiconductor devices. FIGS. 2A-D illustrate an example process for removing such material to form a "patterned" layer of elastomeric material.

As used herein, "patterning" refers to removing one or more regions from a layer of material such that remaining regions of the layer form a desired pattern. The desired pattern corresponds to an arrangement of semiconductor devices. For example, if individual semiconductor dies are arranged in a 3×3 grid, then a layer of material may be patterned to mirror the grid arrangement. This can be achieved based on singulating the layer of material according to the grid arrangement of the dies. As another example, if arrays of unsingulated semiconductor devices are arranged in a 1×3 grid, then a layer of material may be patterned based on removing regions of the layer positioned over gaps between arrays.

"Patterning" can be performed using a layered structure, such as the one illustrated in the example of FIG. 2A. The layered structure 200 comprises a photoresist layer 216, an elastomeric layer 214, an embedded layer 204, and an optional handle layer 202. The layered structure 200 may be obtained based on forming and/or depositing the layers, in order, on top of the handle layer 202. For example, the embedded layer 204 may be formed on the handle layer 202, the elastomeric layer 214 may then be deposited on the embedded layer 204, and the photoresist layer 216 may then be deposited on the elastomeric layer 214.

The handle layer 202 may be a substrate composed of glass, silicon, or any other transparent/quasi-transparent material. The handle layer 202 may facilitate transportation of all or part of the layered structure 200.

The embedded layer 204 comprises sets 206-210 of one or more semiconductor devices embedded in a filling material 212. Although FIG. 2A illustrates the semiconductor devices as being completely embedded in the filling material 212, at a minimum, the filling material 212 is used to fill in the gaps between different sets 206-210 of one or more semiconductor devices.

Figure 2C:
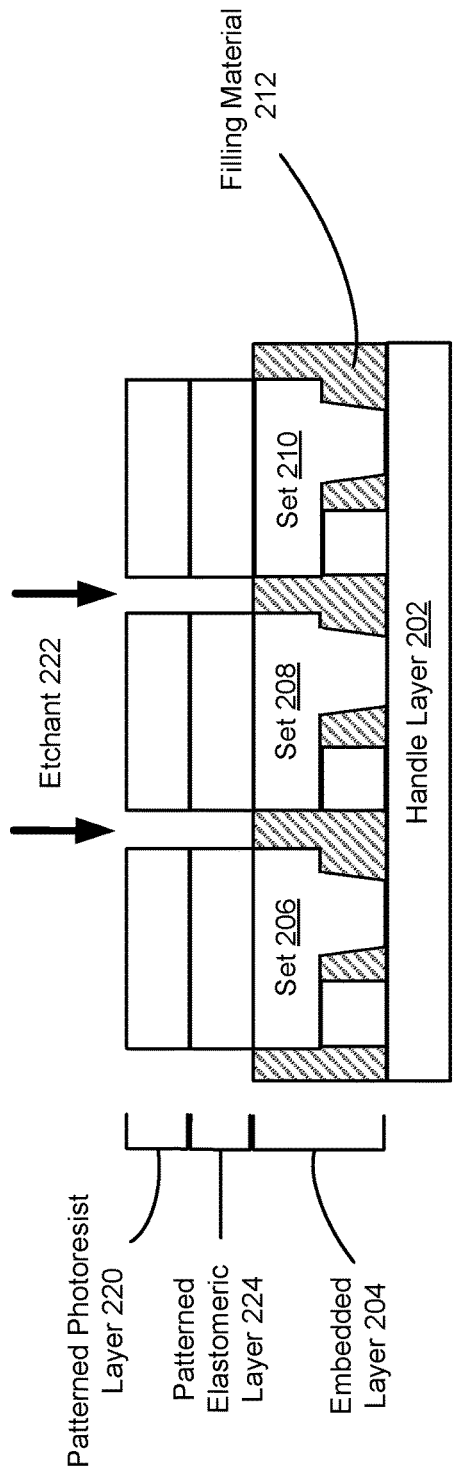

In the example of FIG. 2A, each set consists of a single semiconductor device. However, in some embodiments, each set is an array of unsingulated semiconductor devices. Although the semiconductor devices illustrated in FIGS. 2A-D are abstractions of LED devices, it should be appreciated that the techniques disclosed herein are equally applicable to any other semiconductor devices. Furthermore, although only three semiconductor devices are illustrated in each of FIGS. 2A-D, it should be appreciated that the techniques described herein are equally applicable to any number of semiconductor devices.

The filling material 212 can be formed on the handle layer 202 after placement of the semiconductor devices on the handle layer 202. For reasons that will become apparent below, the filling material 212 is not formed on top of the semiconductor devices. Thus, the semiconductor devices are embedded in the filling material 212 such that the top surfaces of the filling material 212 are flush with the top surfaces of the semiconductor devices. The filling material 212 can be any of a variety of polymers including, without limitation, polyvinyl alcohol, polyvinyl acetate, polyester, polymethyl methacrylate, polystyrene, polycarbonate, or polyvinyl butyral.

The elastomeric layer 214 may be composed of a viscoelastic polymer, such as polydimethylsiloxane (PDMS) or polyurethane, that is transparent/quasi-transparent. The conformable material in the elastomeric layer 214 can adhere to a PUT surface composed of a non-conformable material, such as fused silica, sapphire, etc. Adhesion can be achieved based on exploiting weak intermolecular forces, such as Van der Waals forces. In some embodiments, the elastomeric layer 214 also exhibits optical properties including, without limitation, a tunable refractive index and/or temporal stability (e.g., about 30,000 hours at or below 80 degrees Celsius). The elastomeric layer 214 may be deposited on the embedded layer 204 using any of a variety of techniques, such as spin-coating.

The photoresist layer 216 may be composed of a photosensitive polymer which, when exposed to light within a particular wavelength range, becomes soluble to a photoresist developer. In some embodiments, the elastomeric layer 214 is made hydrophilic prior to depositing the photoresist layer 216 thereon. This can be achieved using any of a variety of techniques, such as treatment of the elastomeric layer 214 with oxygen plasma. A hydrophilic elastomeric layer 214 facilitates uniform deposition of the photoresist layer 216.

Referring to FIG. 2B, the photoresist layer 216 of FIG. 2A is structured to form a patterned photoresist layer 220. Patterning the photoresist layer 216 involves transmitting light 218 through the elastomeric layer 214 toward the photoresist layer 220 (e.g., in a bottom-to-top direction). Doing so uses the sets 206-210 as a light mask that blocks light from reaching the photoresist layer 216. Thus, light 218 reaches the photoresist layer 216 via the filling material 212 that separates the sets 206-210. Regions of the photoresist layer 216 exposed to light 218 become soluble and are washed away using a photoresist developer. Light 218 typically has a wavelength that falls within a range that is strongly absorbed by the semiconductor material. For example, when the semiconductor material is gallium nitride, light 218 may have a wavelength that falls within the ultraviolet range (e.g., less than 360 nanometers) of the electromagnetic spectrum, because wavelengths in that range are strongly absorbed by gallium nitride. This enables the semiconductor material to serve as masking material against the light 218.

In the example of FIG. 2B, the patterned photoresist layer 220 comprises three remaining regions of the photoresist layer 216. Significantly, these remaining regions have shapes that are substantially similar, if not identical, to those of the sets 206-210 used as a light mask.

Referring to FIG. 2C, the elastomeric layer 214 of FIG. 2B is structured to form a patterned elastomeric layer 224. Patterning the elastomeric layer 214 can be achieved based on an etching process in which the patterned photoresist layer 220 is used as an etch mask. The etching process may involve one or more etching techniques, such as dry etching, wet etching, or combinations thereof. In the example of FIG. 2C, the etching process involves an anisotropic dry etching technique using an etchant 222. Examples of dry etching techniques include, without limitation, Radio Frequency (RF) oxygen plasma etching, reactive ion etching (ME), and/or inductively coupled plasma (ICP) etching.

In some embodiments, the etchant 222 comprises a plasma mixture of sulfur hexafluoride and oxygen that is used to perform an ICP etch. Significantly, the etchant 222 is accelerated in a direction (e.g., a top-to-bottom direction) that is opposite to the direction in which light 218 was transmitted during formation of the patterned photoresist layer 220. Thus, the patterned photoresist layer 220 can be used as an etch mask that protects underlying regions of the elastomeric layer 214 from the etchant 222. In other words, the patterned photoresist layer 220 leaves unprotected regions of the elastomeric layer 214 to be eroded by the etchant 222. In the example of FIG. 2C, the resulting patterned elastomeric layer 224 comprises three remaining regions of the elastomeric layer 214. Significantly, these remaining regions have shapes that are substantially similar, if not identical, to those of the sets 206-210.

Figure 2D:
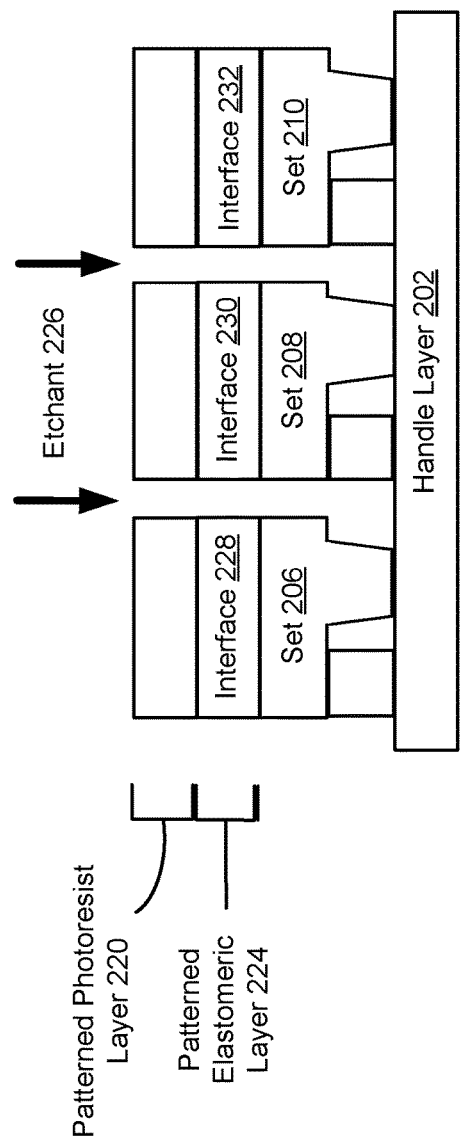

All or part of the patterned photoresist layer 220 may be eroded during the aforementioned etching process. The amount of patterned photoresist layer 220 allowed to remain after the etching process may depend on the technique used to remove the filling material 212. In the example of FIG. 2D, further etching is performed to remove the filling material 212. Thus, some or all of the patterned photoresist layer 220 remains on the patterned elastomeric layer 224 to protect the underlying patterned elastomeric layer 224.

Referring to FIG. 2D, an etchant 226 is used to etch the filling material 212 of FIG. 2C. The etchant 226 may be the same or different from the etchant 222. In the example of FIG. 2D, the etchant 226 comprises oxygen plasma for performing RF oxygen plasma etching. In some embodiments, the patterned photoresist layer 220 is completely eroded upon removal of the filling material 212. In some embodiments, any remnants of the patterned photoresist layer 220 are subsequently removed in a separate process. When the patterned photoresist layer 220 is completely eroded or otherwise removed, elastomeric interfaces 228-232 are revealed.

Significantly, the aforementioned techniques enable consistent and efficient formation of elastomeric interfaces 228-232 having shapes that are substantially similar, if not identical, to those of sets 206-210. In contrast, conventional techniques may result in elastomeric interfaces 228-232 that are misshapen and/or misaligned relative to sets 206-210. For example, some conventional techniques may form the patterned photoresist layer 220 in a separate photolithography process that introduces errors.

As will be described in greater detail below, elastomeric interfaces 228-232 enable semiconductor devices to interface with a PUT and/or an optics mold.

Pick-and-Place

Figure 3A:
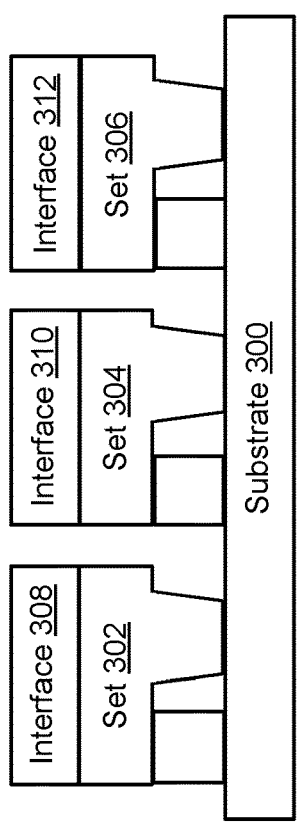
FIGS. 3A-B illustrate an example approach for picking up and placing semiconductor devices, in accordance with an embodiment.
Figure 3B:
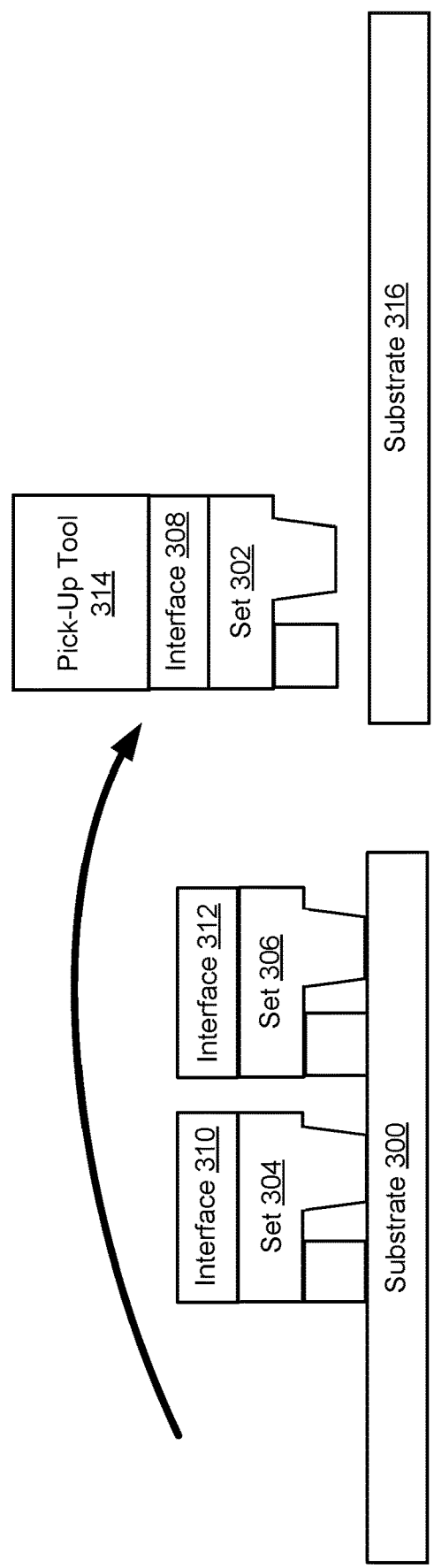

FIGS. 3A-B illustrate an example pick-and-place process for transporting semiconductor devices from one substrate to another. A pick-and-place process is often used in the electronics industry for mounting semiconductor devices on a printed circuit board based on manipulating individual sets of one or more semiconductor devices. For example, a pick-and-place process may be used for assembling a display system based on positioning LEDs onto designated pixel locations.

Referring to FIG. 3A, sets 302-306 are positioned on substrate 300, which may facilitate transportation of the sets 302-306 between stations of a fabrication system. For example, the substrate 300 may be used to transport the sets 302-306 from an epitaxial growth station to a pick-and-place station. Each set of the sets 302-306 comprises one or more semiconductor devices. Interfaces 308-312 are respectively positioned on the sets 302-306. The interfaces 308-312 may be composed of any material suitable for a pick-and-place process. For example, the interfaces 308-312 may be composed of a conformable material that adheres to a non-conformable pick-up surface.

In some embodiments, FIG. 3A illustrates the result of removing the patterned photoresist layer 220 of FIG. 2D. In other words, the substrate 300 may be the handle layer 202, the sets 302-306 may be the sets 206-210, and the interfaces 308-312 may be the interfaces 228-232.

Referring to FIG. 3B, a pick-up tool 314 is used to transport the set 302 from the substrate 300 to a target substrate 316. In some embodiments, the target substrate 316 comprises circuitry for operating the set 302. For example, the target substrate 316 may comprise a printed circuit board for a display system. A scanning electron microscope (SEM) or some other visual feedback system (not shown) may facilitate alignment of the set 302 with a desired position on the substrate 316.

Transportation of the set 302 is enabled by adhesion between the pick-up tool 314 and the interface 308. In some embodiments, the interface 308 adheres to the pick-up tool 314 based on forming weak intermolecular bonds. In general, adhesion forces increase in strength with an increase in the contact surface between the interface 308 and the pick-up tool 314.

Optics Formation

Figure 4A:
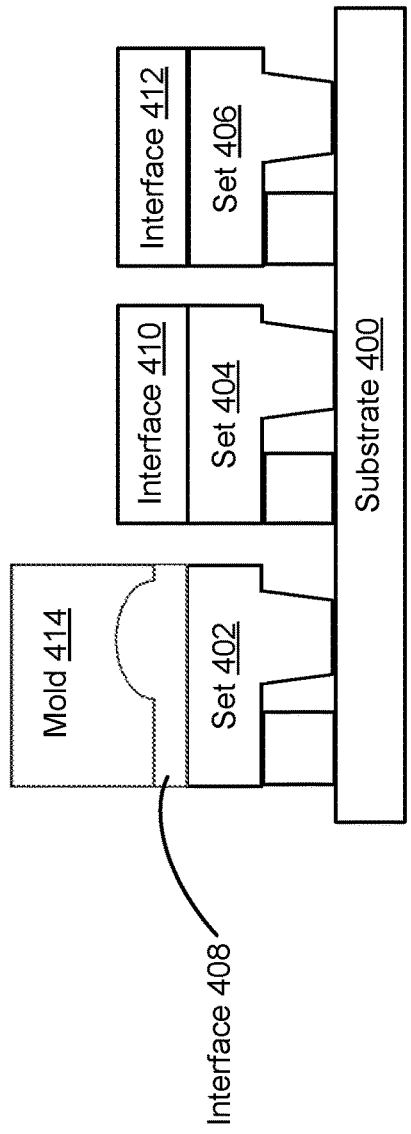
FIGS. 4A-B illustrate an example approach for molding optical elements on semiconductor devices, in accordance with an embodiment.
Figure 4B:
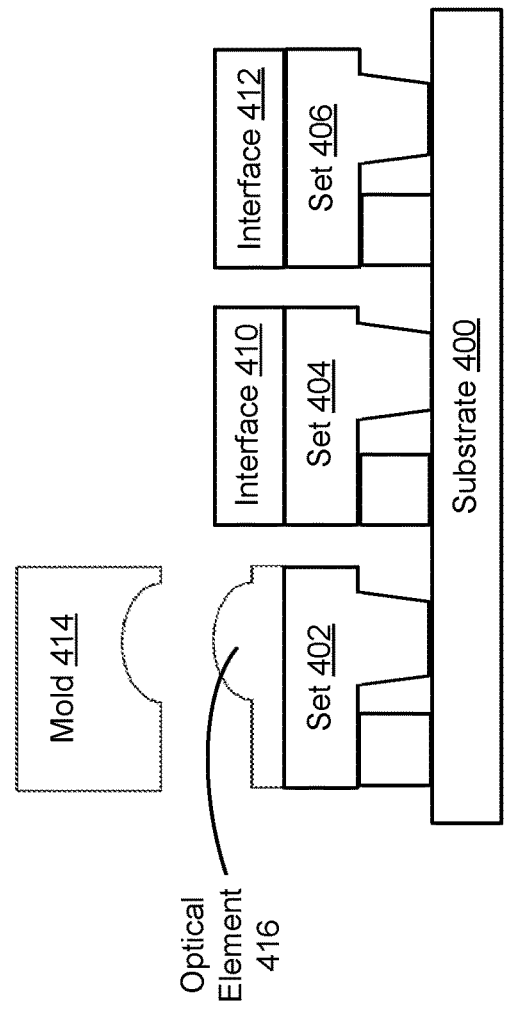

FIGS. 4A-B illustrate an example process for forming optical elements on semiconductor devices. Each optical element may correspond to a different semiconductor device. As mentioned above, optical elements may be formed on light-emitting surfaces of LEDs to enable further collimation of light. Thus, such optical elements may be referred to as "secondary optics", where "primary optics" refer to mesa-shaped semiconductor structures.

Referring to FIG. 4A, sets 402-406 are positioned on substrate 400. Each set of the sets 402-406 comprises one or more semiconductor devices. In the example of FIG. 4A, each set consists of a single semiconductor device. However, in some embodiments, each set is an array of unsingulated semiconductor devices. Although FIG. 4A illustrates three sets, it should be appreciated that the techniques described herein are equally applicable to any number of sets.

In some embodiments, the substrate 400 may be the target substrate 316 of FIG. 3B. Thus, the sets 402-406 may have been subjected to a pick-and-place process involving interfaces 408-412. The sets 402-406 may be transported to the substrate 400 from a plurality of substrates comprising a red LED substrate, a green LED substrate, and a blue LED substrate.

One or more optical elements may be formed on each set of the sets 402-406 based on pressing a mold 414 against each interface of the interfaces 408-412. A SEM or some other visual feedback system (not shown) may facilitate alignment of the mold 414 with a particular interface. In particular, alignment may be performed based on leveraging photoluminescence properties of some semiconductor devices, such as LEDs. More specifically, such a semiconductor device can be irradiated with ultraviolet light, thereby exciting the semiconductor device into emitting fluorescent light. This fluorescent light can be aligned to the center of an optics formation cavity in the mold 414. Thus, the center of an optical element can be more precisely aligned with the center of a light-emitting region of a semiconductor device.

Although the mold 414 is illustrated in the example of FIG. 4A as having only one molded shape, in some embodiments, the mold 414 has a plurality of molded shapes. Each molded shape of the mold 414 is a cavity having a "negative" image of an optical element. Thus, when the mold 414 is pressed against an interface of the interfaces 408-412, the mold 414 transfers each molded shape to the interface, thereby forming a "positive" image of the optical element in the interface. As used herein, a negative image refers to an image that is inverted/recessed/debossed relative to its environment, whereas a positive image refers to an image that is raised/embossed relative to its environment.

As mentioned above, the interfaces 408-412 may be composed of a conformable material, such as PDMS or some other elastomeric material. The mold 414 can be made of any of a variety of materials that have superior structural robustness relative to the interfaces 408-412. For example, the interfaces 408-412 are composed of a conformable material, and the mold 414 may be composed of a non-conformable material, such as glass or fused silica.

Referring to FIG. 4B, an optical element 416 is revealed when the mold 414 is separated from the interface 408. Molding the optical element 416 in the interface 408 can be facilitated by heating the interface 408. For example, heating the substrate 400 may cause the interface 408 to be heated to a high temperature (e.g., 270 degrees Celsius) that facilitates imprinting. However, when the substrate 400 is a component of a display system, heating the substrate 400 to a high temperature may damage the display system.

Concurrent Pick-and-Place and Optics Formation

FIGS. 5A-D illustrate an example process for performing pick-and-place concurrently with optic(s) molding. For the sake of clarity and ease of explanation, FIGS. 5A-D illustrate a single set of three semiconductor devices. However, it should be appreciated that the techniques described herein are equally applicable to any number of sets comprising any number of semiconductor devices.

Figure 5A:
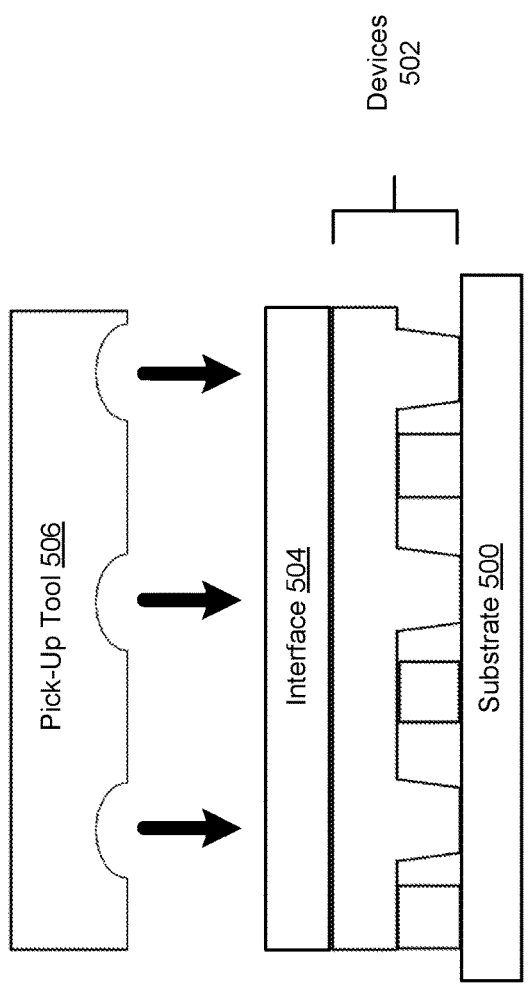
FIGS. 5A-D illustrate an example approach for molding optical elements using a pick-up tool, in accordance with an embodiment.

Referring to FIG. 5A, a set of semiconductor devices 502 is positioned on a substrate 500. The substrate 500 may be the substrate 300 of FIGS. 3A-B and/or the handle layer 202 of FIGS. 2A-D. The set of semiconductor devices 502 has an interface 504 deposited on a light-outputting side of the set (e.g., the top side). The interface 504 may be any of the aforementioned interfaces (e.g., the interfaces 228-232 of FIG. 2D, the interfaces 308-312 of FIGS. 3A-B, and/or the interfaces 408-412 of FIG. 4A).

A pick-up tool 506 is pressed against the interface 504. A SEM or some other visual feedback system (not shown) may facilitate alignment of the pick-up tool 506 with the interface 504. As mentioned above, alignment may be performed based on leveraging photoluminescence properties of some semiconductor devices, such as LEDs. All or part of the pick-up tool 506 may be composed of a transparent/quasi-transparent material through which ultraviolet light may be transmitted toward a semiconductor device. The fluorescent light emitted from the semiconductor device may be aligned to the center of a cavity in the pick-up tool 506. Significantly, the pick-up tool 506 performs the functions of both the pick-up tool 314 of FIG. 3B and the mold 414 of FIGS. 4A-B. Thus, it is unnecessary to perform separate alignments for (a) pick-and-place and (b) optics formation. Advantageously, this reduces errors caused by misalignment.

The pick-up tool 506 has molded shapes that are transferred to the interface 504 when the pick-up tool 506 is pressed against the interface 504. In some embodiments, the interface 504 is composed of a conformable material, and at least a pick-up surface of the pick-up tool 506 is composed of a non-conformable material. Although FIG. 5A illustrates the pick-up tool 506 as having three molded shapes, it should be appreciated that the pick-up tool 506 can have any number of molded shapes, including one molded shape.

Figure 5B:
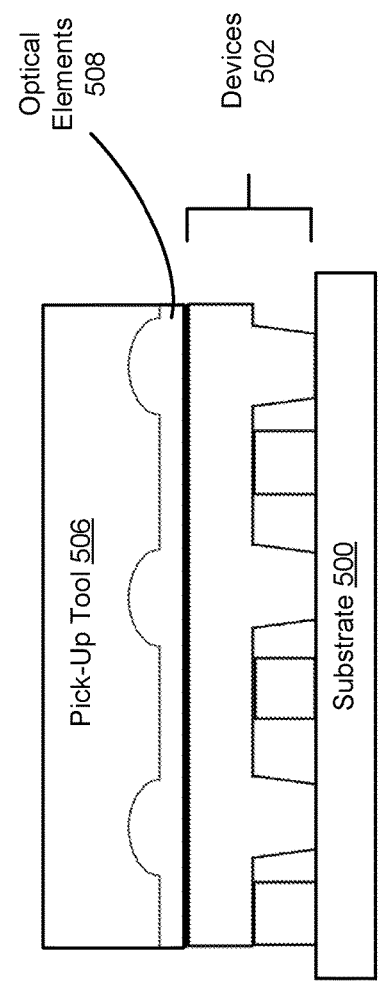

Referring to FIG. 5B, optical elements 508 are formed in the interface 504 when the pick-up tool 506 is pressed against the interface 504. The number of optical elements 508 that are formed corresponds to the number of molded shapes in the pick-up tool 506. Furthermore, the number of optical elements 508 corresponds to the number of semiconductor devices 502.

In some embodiments, formation of the optical elements 508 is facilitated by heating the interface 504 to a high temperature. This can be achieved based on using a hot plate to apply heat to the substrate 500 and/or using laser light (e.g., ultraviolet light that is converted into heat when absorbed) to irradiate the layer of semiconductor material in contact with the interface 504. Significantly, by heating the interface 504 prior to placing the devices 502 on a display system, damaging the display system is avoided.

Figure 5C:
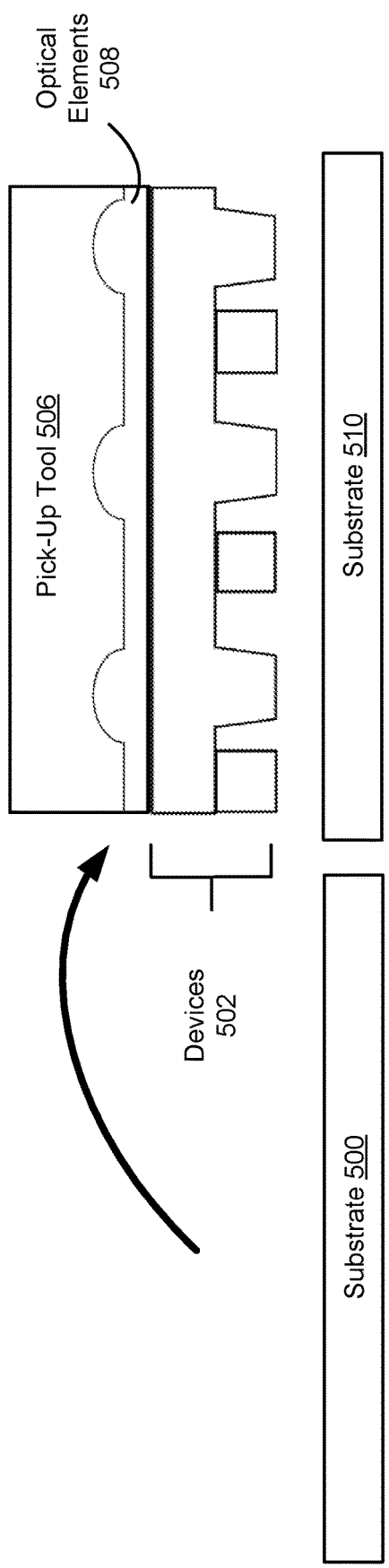

Referring to FIG. 5C, pressing the pick-up tool 506 against the interface 504 also causes the pick-up tool 506 to adhere to the interface 504 in which the optical elements 508 have been formed. This enables the devices 502 to be picked up and placed on a substrate 510. In some embodiments, the substrate 510 is a component of a display system that incorporates the devices 502.

Figure 5D:
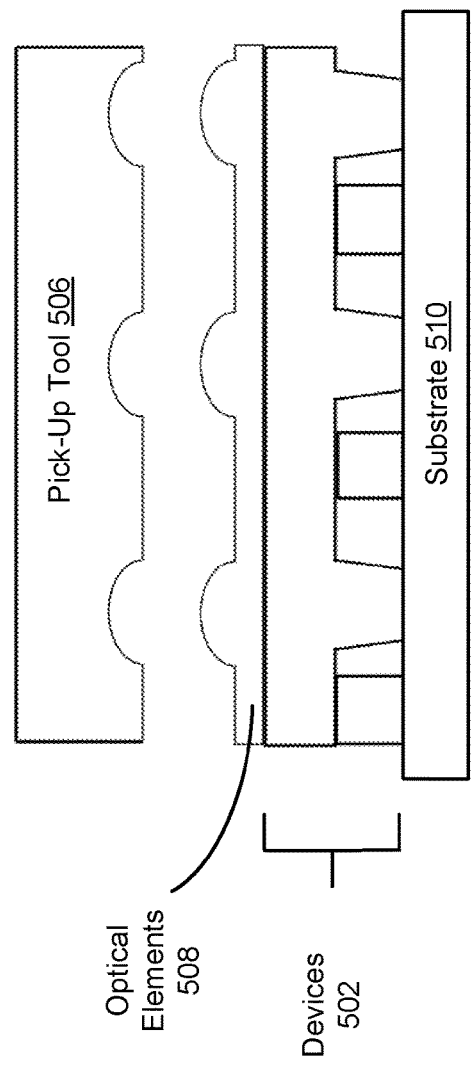

Referring to FIG. 5D, the pick-up tool 506 is separated from the interface 504 in which the optical elements 508 have been formed. Doing so reveals the optical elements 508 that enable increased light collimation. Separating the pick-up tool 506 from the interface 504 also enables light to emanate from the optical elements 508 when a voltage is applied across the devices 502.

Removal of Excess Interface Material

Figure 6A:
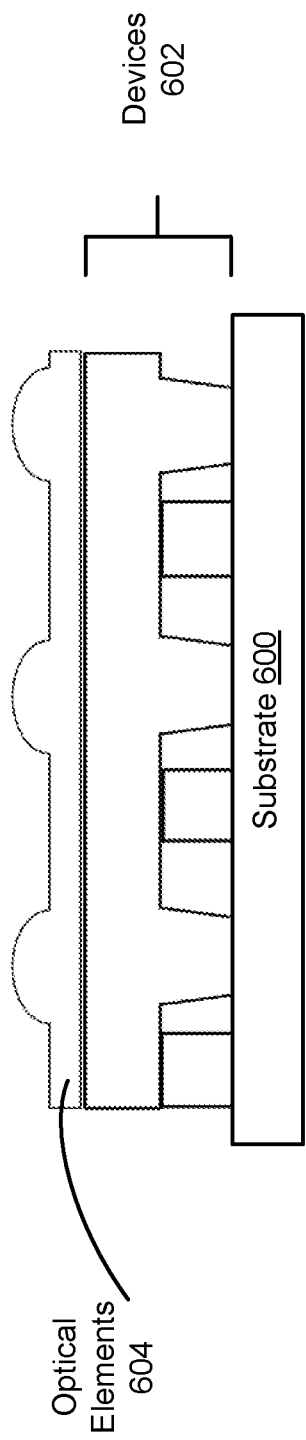
FIGS. 6A-B illustrate an example approach for removing excess elastomeric material, in accordance with an embodiment.
Figure 6B:
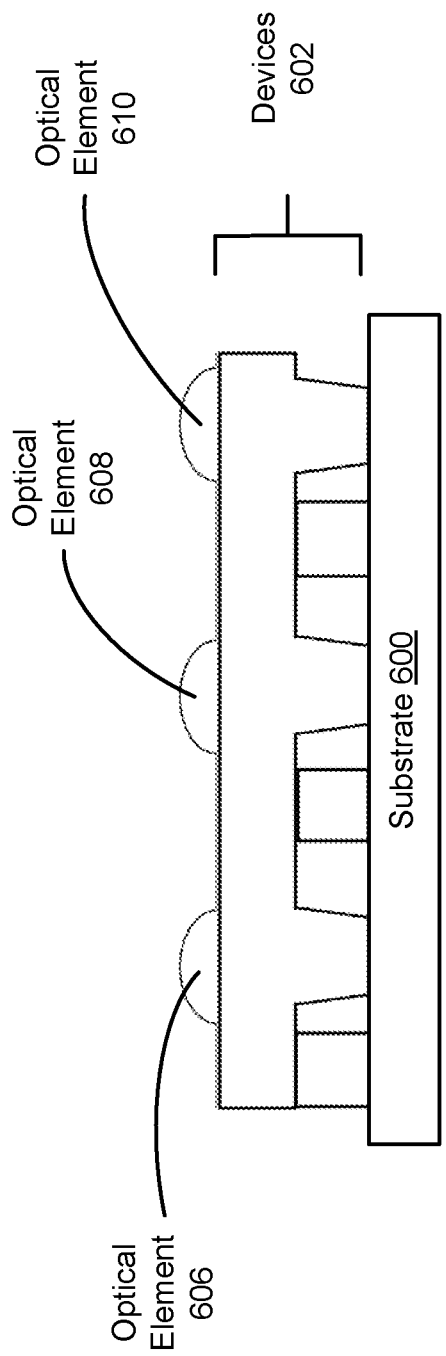

FIGS. 6A-B illustrate an example process for removing excess material surrounding one or more optical elements. The excess material may have the undesirable effect of scattering light. Furthermore, in an array of unsingulated LEDs, the excess material may have the undesirable effect of causing cross-talk between pixels. Thus, it is beneficial to remove as much of the excess material as possible.

Referring to FIG. 6A, a set of semiconductor devices 602 is positioned on a substrate 600. Optical elements 604 are formed on the devices 602. FIG. 6A may illustrate the result of performing the process of FIGS. 4A-B or FIGS. 5A-D.

Referring to FIG. 6B, excess material is removed from one or more regions surrounding optical elements 606-610. This may be achieved based on an etching process.

Process Overview

Figure 7:
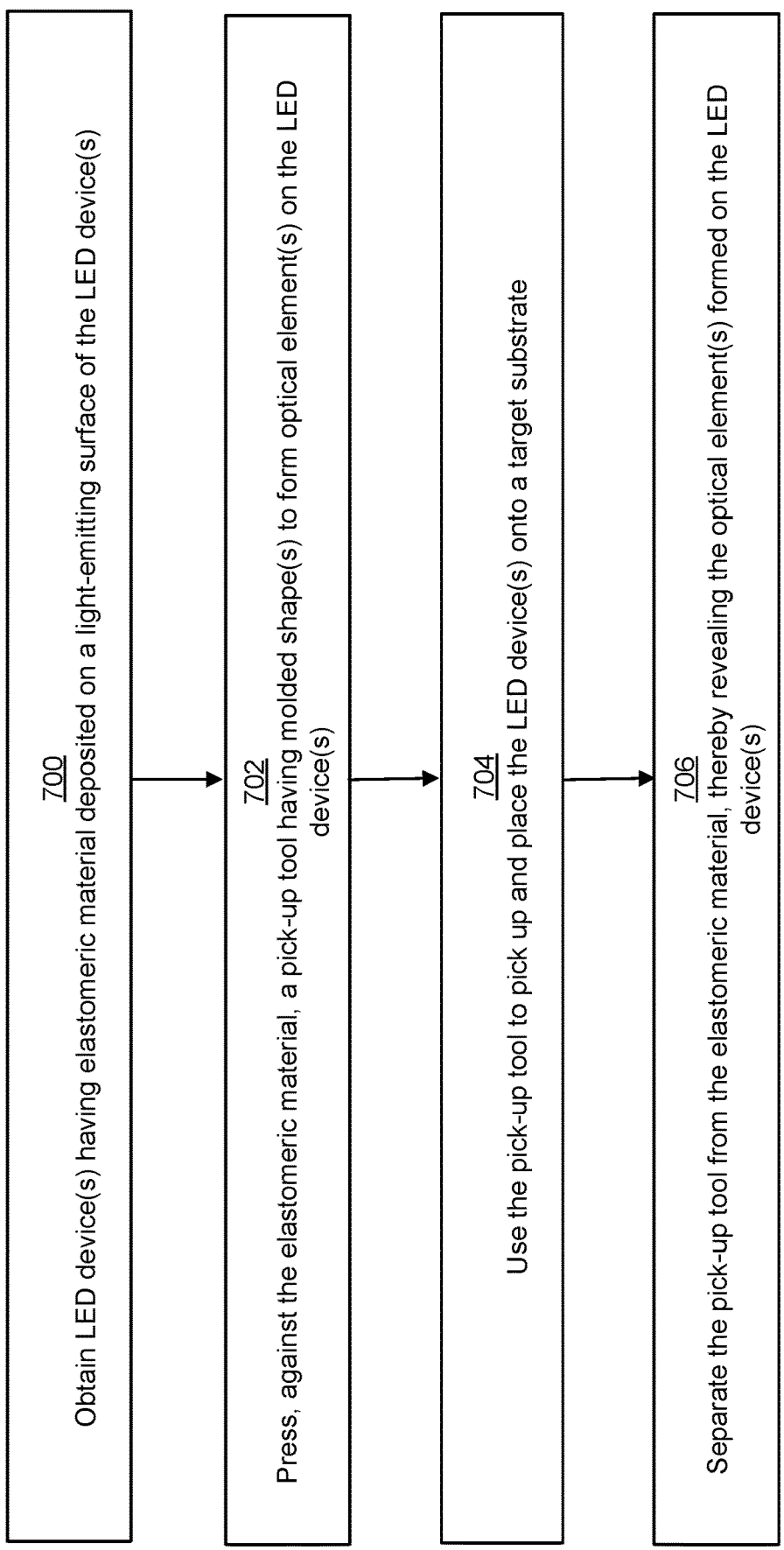
FIG. 7 is a flow diagram illustrating an example approach for forming optical elements on semiconductor devices, in accordance with an embodiment.

FIG. 7 illustrates an example process for forming optical elements with a PUT. In some embodiments, the example process is performed at a station of a fabrication system that incorporates LEDs into display systems.

At block 700, the station obtains a set of one or more LED devices having one or more elastomeric interfaces deposited on a light-outputting side of the set. In some embodiments, the set comprises a plurality of unsingulated LED devices. One or more other stations may have produced the set from a layered structure according to the process illustrated in FIGS. 2A-D.

More specifically, the process of FIGS. 2A-D involves the one or more other stations obtaining the layered structure. The layered structured includes an embedded layer, an elastomeric layer, and a photoresist layer. The embedded layer comprises multiple sets of one or more LED devices embedded in a filling material. The elastomeric layer is deposited on the embedded layer. The photoresist layer is deposited on the elastomeric layer.

The process of FIGS. 2A-D also involves the one or more other stations patterning the photoresist layer by using the multiple sets of one or more LED devices as a mask in a first direction. This may involve transmitting light through the elastomeric layer toward the photoresist layer.

Furthermore, the process of FIGS. 2A-D involves the one or more other stations patterning the elastomeric layer using the patterned photoresist layer as a mask in a second direction that is opposite the first direction. This may involve etching the elastomeric layer.

After patterning the elastomeric layer, the one or more other stations may remove the filling material and the patterned photoresist layer. This reveals the multiple sets of one or more LED devices having the patterned elastomeric layer deposited thereon.

At block 702, the station causes a PUT to be pressed against the one or more elastomeric interfaces. This causes the PUT to adhere to the one or more elastomeric interfaces. This also causes the PUT to transfer one or more molded shapes of the PUT to the one or more elastomeric interfaces. Thus, one or more optical elements are formed in the one or more elastomeric interfaces. The one or more optical elements include at least one of a group comprising a lens, a waveguide, and a diffraction grating. Each optical element corresponds to a respective LED device of the set.

At block 704, the station uses the PUT to pick up and place the set onto a target substrate. This is enabled by the adhesion between the PUT and the one or more elastomeric interfaces.

At block 706, the station separates the PUT from the one or more elastomeric interfaces. This reveals the one or more optical elements on the set.

In some embodiments, elastomeric material surrounding the one or more optical elements may be removed from the one or more elastomeric interfaces.

System Overview

Figure 8:
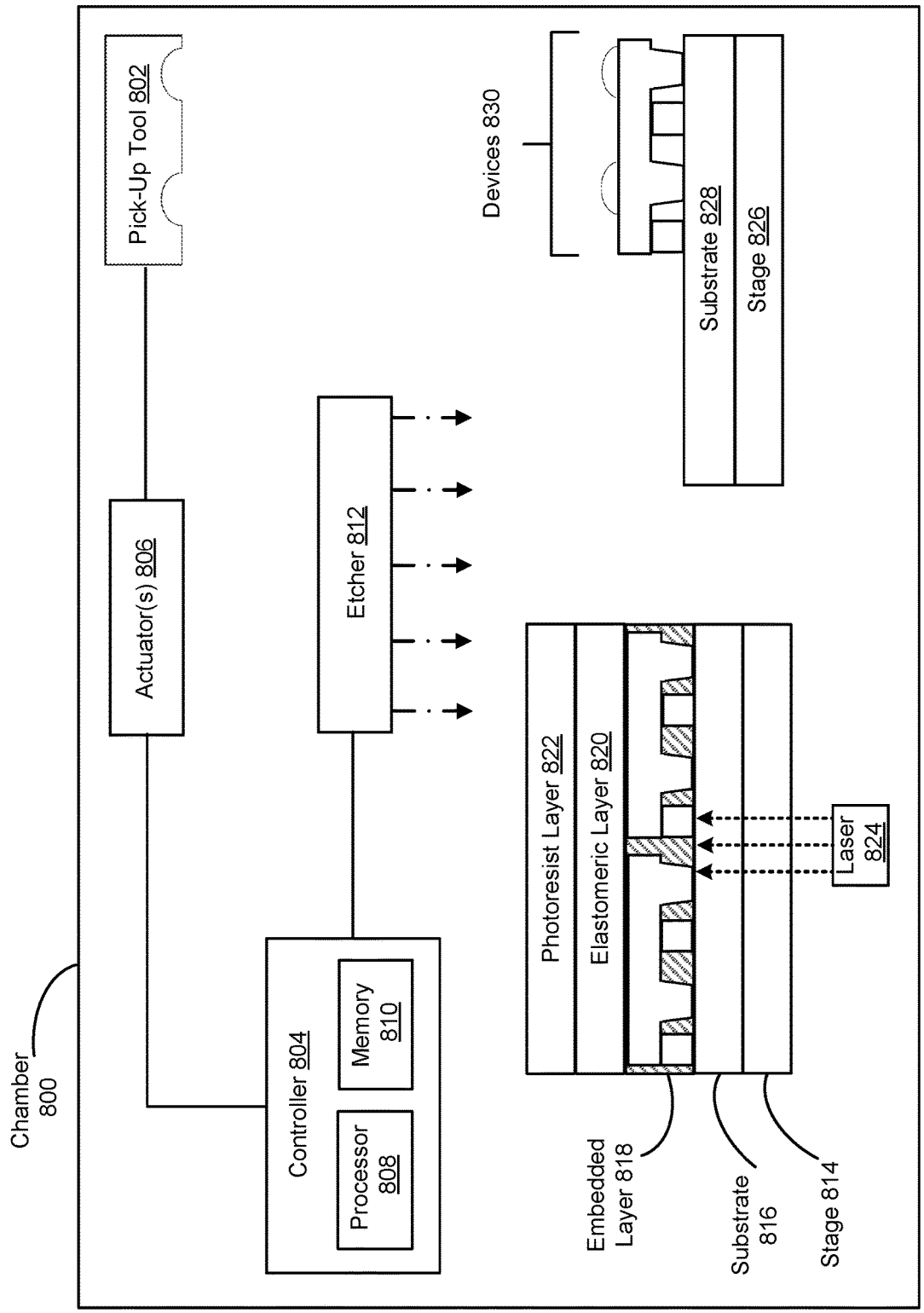
FIG. 8 illustrates an example fabrication system, in accordance with an embodiment.

FIG. 8 illustrates an example fabrication system. In some embodiments, the fabrication system comprises a station that incorporates LED devices into a display system. The fabrication system includes a chamber 800 that defines an interior environment for incorporating LED devices into a display system. The chamber 800 houses various system components including a pick-up tool 802; a controller 804; actuator(s) 806; an etcher 812; substrates 816 and 828; stages 814 and 826; and a laser 824. The chamber 800 may also house other system components not illustrated in FIG. 8. For example, the chamber 800 may also house a SEM in a high pressure atmosphere of water vapor.

It should be appreciated that the example fabrication system of FIG. 8 is merely provided as an illustrative and non-limiting example and that one or more components may be modified, removed, or added to the example fabrication system without departing from the scope of the disclosure. For example, the embodiment illustrated in FIG. 8 may be practiced with a collimated lamp or some other light source instead of the laser 824. Different implementations may use different light sources so long as light within a suitable wavelength range is proviced. For example, when the LED devices are composed of gallium nitride, a laser or a collimated lamp may be used to provide light in the ultra-violet wavelength range (e.g., having emission line wavelengths lower than 360 nanometers) of the electromagnetic spectrum.

The substrate 816 serves as a carrier for a layered structure comprising an embedded layer 818, an elastomeric layer 820, and a photoresist layer 822. The substrate 816 can be any of a variety of materials on which the layered structure can be carried. Example materials include, without limitation, glass, silicon, or some other transparent/quasi-transparent material through which light (e.g., ultraviolet light) can be transmitted.

In the example of FIG. 8, the embedded layer 818 comprises two arrays of LED devices, each array having two unsingulated LED devices. Typically, the LED devices in each array emit light of the same color. In contrast to singulated LED devices, arrays of unsingulated LED devices offer the benefit of facilitating alignment processes. More specifically, it is easier to align a relatively large array of devices than to align an individual device that is relatively small.

The stage 814 holds the substrate 816. The stage 814 may be movable in a variety of directions including, without limitation, up and down; left and right; and forward and back.

The laser 824 transmits light for patterning the photoresist layer 822. For example, a laser beam may be transmitted through the substrate 816, embedded layer 818, and elastomeric layer 820. The embedded layer 818 filters some of the light such that only some regions of the photoresist layer 822 are exposed to the light. These regions can be washed away to form a pattern in the photoresist layer 822. In some embodiments, the laser 824 is incorporated into the stage 814.

As mentioned above, instead of using the laser 824, some fabrication systems may use a collimated lamp or some other light source to pattern the photoresist layer 822. Thus, the particular light source that is used may vary from implementation to implementation so long as light in an appropriate wavelength range is provided. For example, when the LED devices are composed of gallium nitride, any source of ultraviolet light (e.g., having a wavelength of less than 360 nanometers) may be used.

The etcher 812 erodes regions of the elastomeric layer 820 based on instructions received from the controller 804. More specifically, the etcher 812 bombards the elastomeric layer 820 with plasma, some of which is blocked by the patterned photoresist layer 822. Regions of the elastomeric layer 820 that are not protected by the patterned photoresist layer 822 are eroded such that elastomeric interfaces are formed.

The etcher 812 may include gas intake and gas out-take valves, ionizing plates, and any other standard etching components. In some embodiments, the etcher 812 is also used to remove the patterned photoresist layer 822 to reveal the underlying elastomeric interfaces.

The pick-up tool 802 is pressed against an elastomeric interface to pick up and place devices 830 on the substrate 828. The substrate 828 may comprise circuitry for a display system. The stage 826 holds the substrate 828 and is movable in a variety of directions including, without limitation, up and down; left and right; and forward and back.

Furthermore, the pick-up tool 802 has a surface with molded shapes for forming optical elements. Thus, pressing the pick-up tool 802 against an elastomeric interface also causes optical elements to be formed on the devices 830.

The pick-up tool 802 is operatively coupled to the actuator(s) 806. The actuator(s) 806 electromechanically control the movement of the pick-up tool 802 based on instructions from the controller 804. The actuator(s) 806 may move the pick-up tool 802 in a variety of directions including, without limitation, up and down; left and right; and forward and back. Examples of actuator(s) 806 include, without limitation, a rotating motor, a linear motor, and/or a hydraulic cylinder.

The controller 804 is coupled, via the actuator(s) 806, to the pick-up tool 802 and controls the operations of the pick-up tool 802. The controller 804 may include, among other components, a memory 810 and processor(s) 808. The memory 810 stores instructions for operating the pick-up tool 802. The memory 810 may be implemented using any of a variety of volatile or non-volatile computer-readable storage media including, without limitation, SRAM, DRAM, and/or ROM. The processor(s) 808 execute the instructions stored in the memory 810 and send instructions toward the pick-up tool 802. In some embodiments, the processor(s) 808 execute the example process illustrated in FIG. 7.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
obtaining a set of one or more light-emitting diode (LED) devices having one or more elastomeric interfaces deposited on a light-outputting side of the set of one or more LED devices;
using a pick-up tool to:
form one or more optical elements in the one or more elastomeric interfaces by pressing the pick-up tool against the one or more elastomeric interfaces, to transfer at least one molded shape from the pick-up tool to the one or more elastomeric interfaces; and
pick up and place the set of one or more LED devices onto a target substrate;
separating the pick-up tool from the one or more elastomeric interfaces, thereby revealing the one or more optical elements formed on the set of one or more LED devices, wherein the one or more optical elements includes at least one of a lens, a waveguide, or a diffraction grating.

2. The method of claim 1, wherein the one or more optical elements are formed in the one or more elastomeric interfaces before the set of one or more LED devices is picked up and placed onto the target substrate.

3. The method of claim 1, wherein the one or more optical elements are formed in the one or more elastomeric interfaces after the set of one or more LED devices is picked up but as the set of one or more LED devices is being placed onto the target substrate.

4. The method of claim 1, further comprising:
removing, from the one or more elastomeric interfaces, elastomeric material surrounding the one or more optical elements.

5. The method of claim 1, wherein the set of one or more LED devices comprises a plurality of unsingulated LED devices.

6. The method of claim 1, wherein obtaining the set of one or more LED devices having the one or more elastomeric interfaces comprises:
obtaining a layered structure that includes an embedded layer comprising multiple sets of one or more LED devices embedded in a filling material, an elastomeric layer deposited on the embedded layer, and a photoresist layer deposited on the elastomeric layer;
patterning the photoresist layer by using the multiple sets of one or more LED devices as a mask in a first direction;
patterning the elastomeric layer using the patterned photoresist layer as a mask in a second direction that is opposite the first direction;
after patterning the elastomeric layer, removing the filling material and the patterned photoresist layer, thereby revealing the multiple sets of one or more LED devices having the patterned elastomeric layer deposited thereon.

7. The method of claim 6, wherein patterning the photoresist layer comprises transmitting light through the elastomeric layer toward the photoresist layer.

8. The method of claim 6, wherein patterning the elastomeric layer comprises etching the elastomeric layer.

9. A display system fabricated by a method comprising:
obtaining a set of one or more light-emitting diode (LED) devices having one or more elastomeric interfaces deposited on a light-outputting side of the set of one or more LED devices;
using a pick-up tool to:
form one or more optical elements in the one or more elastomeric interfaces by pressing the pick-up tool against the one or more elastomeric interfaces, to transfer at least one molded shape from the pick-up tool to the one or more elastomeric interfaces; and
pick up and place the set of one or more LED devices onto a target substrate;
separating the pick-up tool from the one or more elastomeric interfaces, thereby revealing the one or more optical elements formed on the set of one or more LED devices, wherein the one or more optical elements includes at least one of a lens, a waveguide, or a diffraction grating.

10. The display system of claim 9, wherein the one or more optical elements are formed in the one or more elastomeric interfaces before the set of one or more LED devices is picked up and placed onto the target substrate.

11. The display system of claim 9, wherein the one or more optical elements are formed in the one or more elastomeric interfaces after the set of one or more LED devices is picked up but as the set of one or more LED devices is being placed onto the target substrate.

12. The display system of claim 9 fabricated by the method, the method further comprising:
removing, from the one or more elastomeric interfaces, elastomeric material surrounding the one or more optical elements.

13. The display system of claim 9, wherein the set of one or more LED devices comprises a plurality of unsingulated LED devices.

14. The display system of claim 9, wherein obtaining the set of one or more LED devices having the one or more elastomeric interfaces comprises:
obtaining a layered structure that includes an embedded layer comprising multiple sets of one or more LED devices embedded in a filling material, an elastomeric layer deposited on the embedded layer, and a photoresist layer deposited on the elastomeric layer;
patterning the photoresist layer by using the multiple sets of one or more LED devices as a mask in a first direction;
patterning the elastomeric layer using the patterned photoresist layer as a mask in a second direction that is opposite the first direction;
after patterning the elastomeric layer, removing the filling material and the patterned photoresist layer, thereby revealing the multiple sets of one or more LED devices having the patterned elastomeric layer deposited thereon.

15. A non-transitory computer-readable storage medium storing processor-executable instructions for:
obtaining a set of one or more light-emitting diode (LED) devices having one or more elastomeric interfaces deposited on a light-outputting side of the set of one or more LED devices;
using a pick-up tool to:
form one or more optical elements in the one or more elastomeric interfaces by pressing the pick-up tool against the one or more elastomeric interfaces, to transfer at least one molded shape from the pick-up tool to the one or more elastomeric interfaces; and pick up and place the set of one or more LED devices onto a target substrate;

separating the pick-up tool from the one or more elastomeric interfaces, thereby revealing the one or more optical elements formed on the set of one or more LED devices, wherein the one or more optical elements includes at least one of a lens, a waveguide, or a diffraction grating.

16. The non-transitory computer-readable storage medium of claim 15, wherein the one or more optical elements are formed in the one or more elastomeric interfaces before the set of one or more LED devices is picked up and placed onto the target substrate.

17. The non-transitory computer-readable storage medium of claim 15, wherein the one or more optical elements are formed in the one or more elastomeric interfaces after the set of one or more LED devices is picked up but as the set of one or more LED devices is being placed onto the target substrate.

* * * * *